US010854138B2

(12) United States Patent
Shi

(10) Patent No.: US 10,854,138 B2
(45) Date of Patent: Dec. 1, 2020

(54) OLED EXTERNAL COMPENSATION CIRCUIT OF A DEPLETION TYPE TFT

(71) Applicant: Shenzhen China Star Optoelectronics Semiconductor Display Technology Co., Ltd., Shenzhen (CN)

(72) Inventor: Longqiang Shi, Shenzhen (CN)

(73) Assignee: SHENZHEN CHINA STAR OPTOELECTRONICS SEMICONDUCTOR DISPLAY TECHNOLOGY CO., LTD., Shenzhen (CN)

(*) Notice: Subject to any disclaimer, the term of this patent is extended or adjusted under 35 U.S.C. 154(b) by 0 days.

(21) Appl. No.: 16/691,537

(22) Filed: Nov. 21, 2019

(65) Prior Publication Data

US 2020/0090585 A1  Mar. 19, 2020

Related U.S. Application Data

(63) Continuation-in-part of application No. 15/574,837, filed on Nov. 17, 2017, now Pat. No. 10,522,078.

(30) Foreign Application Priority Data

Aug. 14, 2017  (CN) .......................... 2017 1 0693609

(51) Int. Cl.
   *G09G 3/3225* (2016.01)
(52) U.S. Cl.
   CPC ..... *G09G 3/3225* (2013.01); *G09G 2300/043* (2013.01); *G09G 2300/0426* (2013.01)

(58) Field of Classification Search
   CPC .. G09G 3/3208; G09G 3/3233; G09G 3/3258; G09G 2320/045
   See application file for complete search history.

(56) References Cited

U.S. PATENT DOCUMENTS

| | | | |
|---|---|---|---|
| 8,946,994 B2 * | 2/2015 | Oh ......................... | G09G 3/006 315/120 |
| 9,001,012 B2 * | 4/2015 | Yumoto ................... | G09G 5/18 345/76 |
| 9,013,378 B2 * | 4/2015 | Yumoto ............... | G09G 3/3225 345/76 |
| 9,378,673 B2 * | 6/2016 | Oh ........................ | G09G 3/3208 |
| 9,390,652 B2 * | 7/2016 | Chang .................. | G09G 3/3233 |
| 9,570,048 B2 * | 2/2017 | Yumoto ............... | G09G 3/3233 |

(Continued)

*Primary Examiner* — Gene W Lee
(74) *Attorney, Agent, or Firm* — Leong C. Lei

(57) ABSTRACT

An OLED external compensation circuit of a depletion type TFT includes a first thin film transistor, a second thin film transistor, a capacitor, an organic light emitting diode, and a compensation circuit. The second thin film transistor is of a depletion type. The compensation circuit is connected with a first node and a second node. A reset signal is inputted into the compensation circuit. The OLED external compensation circuit is suitable for a depletion type TFT in view of the complicated characteristics of the conventional designs of the depletion type TFT and the OLED external compensation. Other examples of the OLED external compensation circuit of another depletion type TFT are also provided and help reduce the cost of the system chip, thereby achieving cost reduction. The OLED external compensation circuit is compatible with an enhanced TFT circuit of which Vth is positive.

2 Claims, 5 Drawing Sheets

(56) References Cited

U.S. PATENT DOCUMENTS

| | | | | |
|---|---|---|---|---|
| 9,734,799 B2* | 8/2017 | Yumoto | ................... | G09G 5/18 |
| 10,062,330 B2* | 8/2018 | Han | ..................... | G09G 3/3266 |
| 10,062,361 B2* | 8/2018 | Yumoto | ................... | G09G 5/18 |
| 10,083,655 B2* | 9/2018 | Lee | ....................... | G09G 3/3233 |
| 10,109,237 B2* | 10/2018 | Park | ...................... | G09G 3/3258 |
| 2011/0285691 A1* | 11/2011 | Takasugi | .............. | G09G 3/3233 |
| | | | | 345/212 |
| 2012/0287102 A1* | 11/2012 | Toyomura | ........... | G09G 3/3233 |
| | | | | 345/211 |
| 2014/0062331 A1* | 3/2014 | Nam | .................... | G09G 3/3233 |
| | | | | 315/226 |
| 2015/0221252 A1* | 8/2015 | Qing | ................... | G09G 3/3291 |
| | | | | 345/76 |
| 2015/0379934 A1* | 12/2015 | Xiaoling | ............. | G09G 3/3233 |
| | | | | 345/214 |
| 2016/0189635 A1* | 6/2016 | Lee | ...................... | G09G 3/3233 |
| | | | | 345/690 |
| 2018/0144717 A1* | 5/2018 | Kim | ..................... | G09G 3/3233 |
| 2018/0197469 A1* | 7/2018 | Lo | ........................ | G09G 3/3233 |
| 2018/0218681 A1* | 8/2018 | Cai | ....................... | G09G 3/3275 |
| 2018/0233085 A1* | 8/2018 | Wang | ................... | G09G 3/3266 |
| 2018/0269232 A1* | 9/2018 | Cai | ..................... | H01L 51/5206 |
| 2018/0277037 A1* | 9/2018 | Lin | ...................... | G09G 3/3291 |

* cited by examiner

OLED EXTERNAL COMPENSATION CIRCUIT OF A DEPLETION TYPE TFT

CROSS REFERENCE TO RELATED APPLICATIONS

This is a continuation-in-part application of co-pending patent application Ser. No. 15/574,837, filed on Nov. 17, 2017, which is a national stage of PCT Application Number PCT/CN2017/101976, filed on Sep. 15, 2017, claiming foreign priority of Chinese Patent Application Number 201710693609.5, filed on Aug. 14, 2017.

BACKGROUND OF THE INVENTION

Field of Invention

The present invention relates to the field of liquid crystal display, and more particularly to an OLED external compensation circuit of a depletion type TFT.

Description of Prior Art

Organic light Emitting Display (OLED) display device with self-luminous, low driving voltage, high luminous efficiency, short response time, sharpness and contrast, nearly 180° viewing angle, the use of a wide temperature range, flexible display, large area full color display and many other advantages, the industry is recognized as the most development potential of the display device.

FIG. 1 is an illustrative diagram of a conventional 2T1C OLED driving circuit. The conventional OLED driving circuit is composed of 2T1C, that is, a structure with two thin film transistors (TFT) plus a capacitor, to convert the voltage to the current, T1 is a switch TFT, used to control the entering of the data signal Vdata, T2 is a driving TFT, used to control the current through the OLED, Cst is a storage capacitor. Due to prolonged operation, T2 is under severe voltage stress and the threshold voltage Vth will shift. According to the known formula of current, $Ids=\beta/2(Vgs-Vth)^2$, when Vdata is the same, the change of Vth will inevitably lead to the change of Ids. Because the OLED is a current-driving drive, it inevitably affects the brightness of the OLED, which affects the normal display. In order to solve this problem, one idea is to introduce an internal compensation circuit that counteracts the effect of the Vth shift. But the conventional compensation circuit is more complex, the number of TFT is generally more than 5. So many TFTs will occupy a lot of space, and it will inevitably affect the pixel area of the opening area, which is not beneficial for high aperture and high-resolution display design.

The IGZO (indium gallium zinc oxide)-TFT with BCE (Back-channel-etch) structure is the hotspot of the present research. However, the current performance of the IGZO-TFT is mostly as depletion type TFT, that is, the threshold voltage (Vth) is negative. The transfer characteristic curve of the depleted IGZO-TFT is shown in FIG. 2, where the horizontal axis is the voltage (volts) and the vertical axis is the current (amperes). Due to the characteristics of the depleted IGZO-TFT, the circuit design is more complex.

SUMMARY OF THE INVENTION

Therefore, an object of the present invention is to provide an OLED external compensation circuit for a depletion type TFT for the complicated characteristics of the conventional designs of the depletion type TFT and the OLED external compensation.

In order to achieve the object, the present invention provides an OLED external compensation circuit of a depletion type TFT, which comprises a first thin film transistor, a second thin film transistor, a capacitor, an organic light emitting diode, and a compensation circuit. The second thin film transistor is of a depletion type. A gate electrode of the first thin film transistor is inputted with a gate line signal. A source electrode and a drain electrode of the first thin film transistor are respectively inputted with a data signal and connected with a first node. A gate of the second thin film transistor is connected with the first node. A source electrode and a drain electrode of the second thin film transistor are respectively inputted with a DC high voltage power supply and connected with a second node. Two ends of the capacitor are connected with the first node and the second node. A positive electrode of the organic light emitting diode is connected with the second node and a negative electrode of the organic light emitting diode is grounded. The compensation circuit is connected with the first node and the second node. An AC reset signal is inputted to the compensation circuit. The AC reset signal is turned on at a blanking time of each frame when an OLED display device displays an image, and is turned off when normally operated on each frame. When the AC reset signal is turned on, the compensation circuit changes voltages of the first node and the second node.

In the above circuit, the compensation circuit comprises a third thin film transistor that has a gate electrode that is inputted with the AC reset signal and a source electrode and a drain electrode that are respectively inputted with a DC reference potential and connected with the first node; and an additional thin film transistor that has a gate electrode that is inputted with the AC reset signal and a source electrode and a drain electrode that are respectively inputted with the DC reference potential and connected with the second node.

During Operation:

In the first stage, the AC reset signal is at a high potential at which time the third thin film transistor and the additional thin film transistor are turned on and a signal of the DC reference potential is written to the first node and the second node.

In the second stage, the gate line signal and the AC reset signal are at a low potential, the first thin film transistor, the third thin film transistor, and the additional thin film transistor are turned off and the second thin film transistor is still turned on.

In the third stage, when the gate line signal is at a high potential, the first thin film transistor is turned on and the data signal is written to the first node.

The present invention further provides another OLED external compensation circuit of a depletion type TFT, which comprises a first thin film transistor, a second thin film transistor, a capacitor, an organic light emitting diode, and a compensation circuit. The second thin film transistor is of a depletion type. A gate electrode of the first thin film transistor is inputted with a gate line signal. A source electrode and a drain electrode of the first thin film transistor are respectively inputted with a data signal and connected with a first node. A gate of the second thin film transistor is connected with the first node. A source electrode and a drain electrode of the second thin film transistor are respectively inputted with a DC high voltage power supply and connected with a second node. Two ends of the capacitor are connected with at the first node and the second node. A positive electrode of the organic light emitting diode is connected with the second node and a negative electrode of the organic light emitting diode is grounded. The compensation circuit is connected with the first node and the second node. An AC reference potential is inputted to the compensation circuit. The AC reference potential is turned on at a blanking time of each frame when an OLED display device displays an image, and is turned off when normally operated on each frame. When the AC reference potential is turned on, the compensation circuit changes voltages of the first node and the second node.

In the above circuit, the compensation circuit comprises a third thin film transistor and a fourth thin film transistor. The third thin film transistor has a gate electrode that is inputted with the AC reference potential and a source electrode and a drain electrode that are respectively connected with one of a drain electrode and a source electrode of the fourth thin film transistor and the first node. The fourth thin film transistor has a gate electrode that is inputted with the AC reference potential. The other one of the source electrode and the drain electrode of the fourth thin film transistor is also inputted with the AC reference potential. The compensation circuit further comprises a first additional thin film transistor and a second additional thin film transistor. The first additional thin film transistor has a gate electrode that is inputted with the AC reference potential and a source electrode and a drain electrode that are respectively connected with one of a drain electrode and a source electrode of the second additional thin film transistor and the second node. The second additional thin film transistor has a gate electrode that is inputted with the AC reference potential. The other one of the source electrode and the drain electrode of the second additional thin film transistor is also inputted with the AC reference potential.

During Operation:

In the first stage, the AC reference potential is at a high potential at which time the third thin film transistor, the fourth thin film transistor, the first additional thin film transistor, and the second additional thin film transistor are turned on and a signal of the AC reference potential is written to the first node and the second node.

In the second stage, the gate line signal and the AC reference potential are at a low potential, the first thin film transistor, the third thin film transistor, the fourth thin film transistor, the first additional thin film transistor, and the second additional thin film transistor are turned off and the second thin film transistor is still turned on.

In the third stage, when the gate line signal is at a high potential, the first thin film transistor is turned on and the data signal is written to the first node.

The present invention further provides still another OLED external compensation circuit of a depletion type TFT, which comprises a first thin film transistor, a second thin film transistor, a capacitor, an organic light emitting diode, and a compensation circuit. The second thin film transistor is a depletion type. A gate electrode of the first thin film transistor is inputted with a gate line signal. A source electrode and a drain electrode of the first thin film transistor are respectively inputted with a data signal and connected with a first node. A gate of the second thin film transistor is connected with the first node. A source electrode and a drain electrode of the second thin film transistor are respectively inputted with a DC high voltage power supply and connected with a second node. Both ends of the capacitor are connected with at the first node and the second node. A positive electrode of the organic light emitting diode is connected with the second node and the negative electrode of the organic light emitting diode is grounded. The compensation circuit is connected with the first node and the second node. A first AC reference potential and a second AC reference potential are inputted to the compensation circuit. The first AC reference potential and the second AC reference potential are turned on at a blanking time of each frame when an OLED display device displays an image, and are turned off when normally operated on each frame. When the first AC reference potential and the second AC reference potential are turned on. The compensation circuit changes the voltages of the first node and the second node.

In the above circuit, the compensation circuit comprises a third thin film transistor and a fourth thin film transistor. A gate electrode of the third thin film transistor is inputted with the first AC reference potential. A source electrode and a drain electrode of the third thin film transistor are respectively inputted with the first AC reference potential and connected with the first node. A gate electrode of the fourth thin film transistor is inputted with the first AC reference potential. A source electrode and a drain electrode of the fourth thin film transistor are respectively inputted with the second AC reference potential and connected with the second node.

During Operation:

In the first stage, the first AC reference potential and the second AC reference potential are at a high potential at which time the third thin film transistor and the fourth thin film transistor are turned on, a signal of the first AC reference potential is written to the first node and a signal of the second AC reference potential is written to the second node.

In the second stage, the gate line signal and the first AC reference potential are at a low potential, the first thin film transistor, the third thin film transistor, and the fourth thin film transistor are turned off and the second thin film transistor is still turned on.

In the third stage, when the gate line signal is at a high potential, the first thin film transistor is turned on and the data signal is written to the first node.

In summary, the present invention provides an OLED external compensation circuit suitable for a depletion type TFT in view of the complicated characteristics of the conventional designs of the depletion type TFT and the OLED external compensation. The OLED external compensation circuit of another depletion type TFT of the present invention, which reduces the cost of the system chip, thereby achieving cost reduction. The OLED external compensation circuit of another depletion type TFT of the present invention can be compatible with an enhanced TFT (Vth is positive) circuit.

BRIEF DESCRIPTION OF THE DRAWINGS

For better understanding the technical proposals and other beneficial effects of the present invention, please refer the following detailed description of the present invention with the accompanying drawings.

In drawings.

DETAILED DESCRIPTION OF THE PREFERRED EMBODIMENTS

Figure 1:
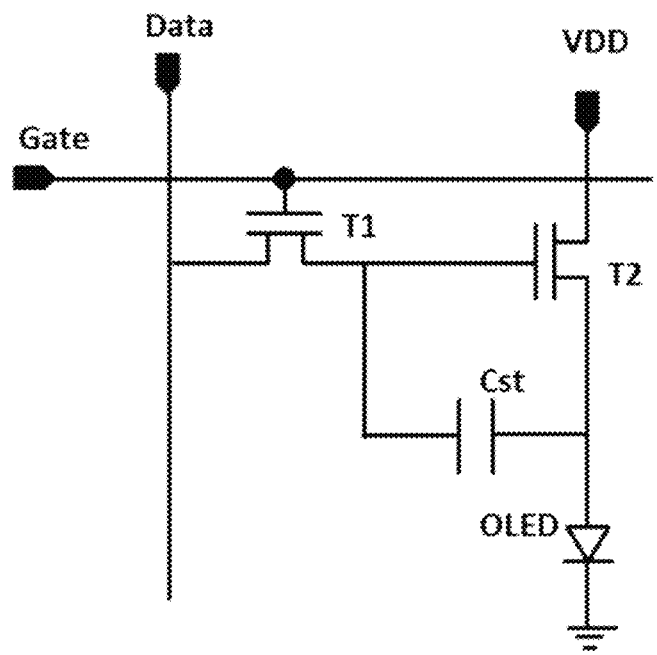
FIG. 1 is an illustrative diagram of an OLED driving circuit of 2T1C according to the conventional art.
Figure 2:
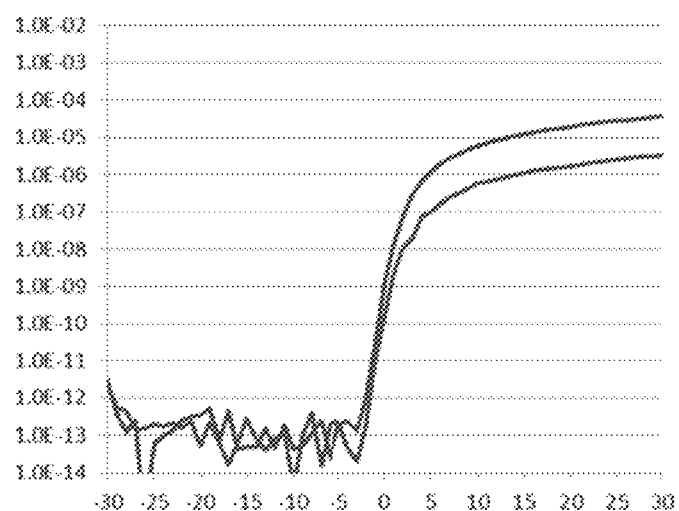
FIG. 2 is a transfer characteristic curve of a depletion type IGZO-TFT.
Figure 3:
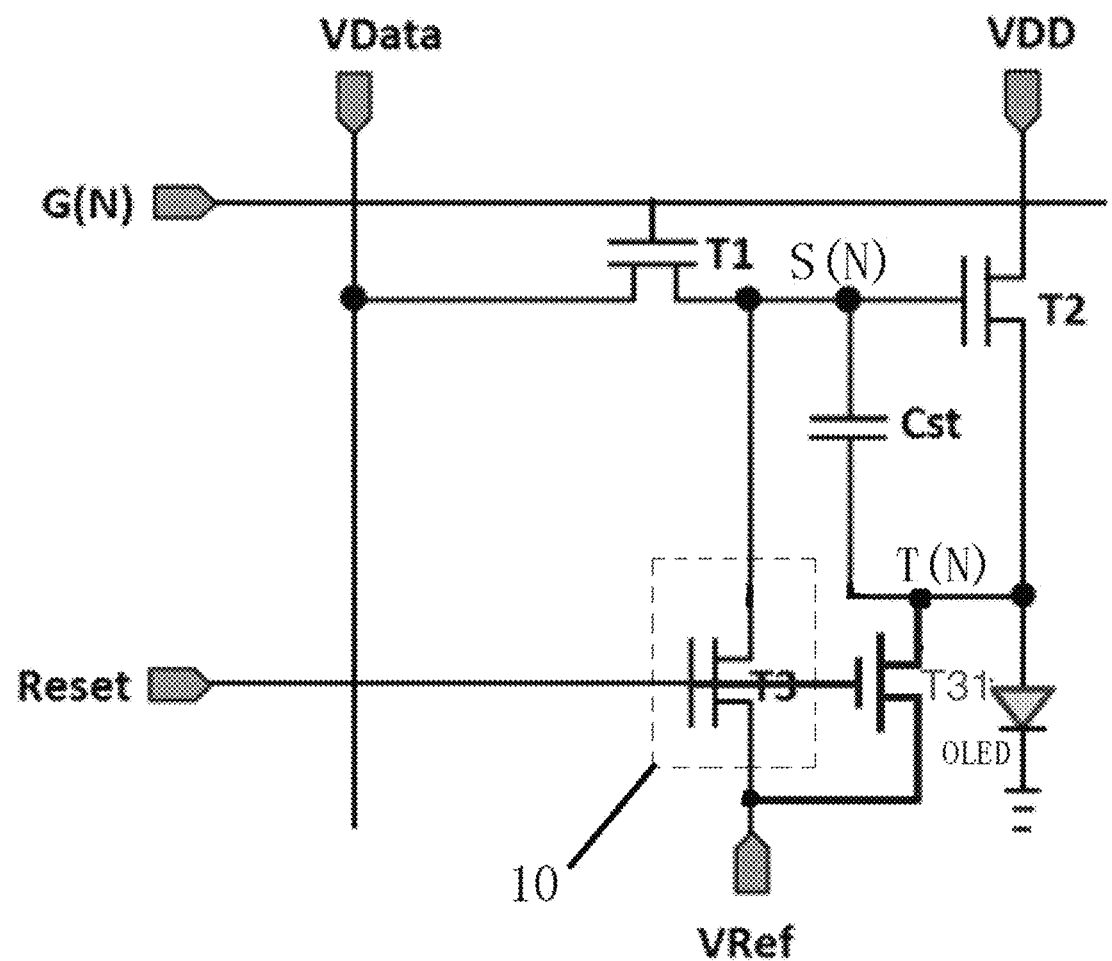
FIG. 3 is a schematic diagram of an OLED external compensation circuit of a first depletion type TFT according to the present invention.

FIG. 3 is a first embodiment of an external compensation circuit according to the present invention. The circuit is composed of three thin film transistors (TFTs), respectively designated as a first TFT (T1) that has a gate electrode, an input electrode that is one of a drain and a source of T1 and an output electrode that is the other one of the source and the drain of T1; a second TFT (T2) that has a gate connected to a node S(N) that is a node between the output electrode of T1 and the gate electrode of T2 and is connected with the output electrode of T1, an input electrode that is one of a source and a drain of T2, and an output electrode that is the other one of the source and drain of T2 and is connected to a node T(N) that is a node between a positive electrode of an OLED and the output electrode of T2 and is connected to the positive electrode of the OLED; and a third TFT (T3), and one capacitor, Cst, which is connected between the node S(N) and the node T(N), and a main difference of the instant embodiment from the known external compensation circuit is that, in addition to T1, T2, and Cst of which the connections have been disclosed in the prior art of FIG. 1, the present invention provides a circuit arrangement that further includes a compensation circuit 10 that comprises the third thin film transistor T3. An additional thin film transistor T31 is also included in the circuit arrangement of this invention. A gate electrode of the third thin film transistor T3 and a gate electrode of the additional TFT T31 are both inputted with an AC reset signal Reset. A source electrode and a drain electrode of the thin film transistor T3 are respectively inputted with a DC reference potential Vref and connected with the node S(N); and a source electrode and a drain electrode of the additional thin film transistor T31 are respectively inputted with the DC reference potential Vref and connected with the node T(N). A negative electrode of the OLED is grounded. Vdata is a data signal and is applied to the input electrode of T1. G(N) is the signal corresponding to any gate line and is applied to the gate electrode of T1. The high potential is 28V and the low potential is −7V. VDD is a direct current (DC) high voltage power supply that is applied to the input electrode of T2 and the potential is generally set to 28V. Vref is the reference potential, which is less than the DC high voltage power supply VDD, and the potential is generally set to 5V. The Reset signal Reset is AC, of which a high potential is 28V and a low potential is −7V.

The depletion TFT of the present invention may be IGZO-TFT.

Figure 4:
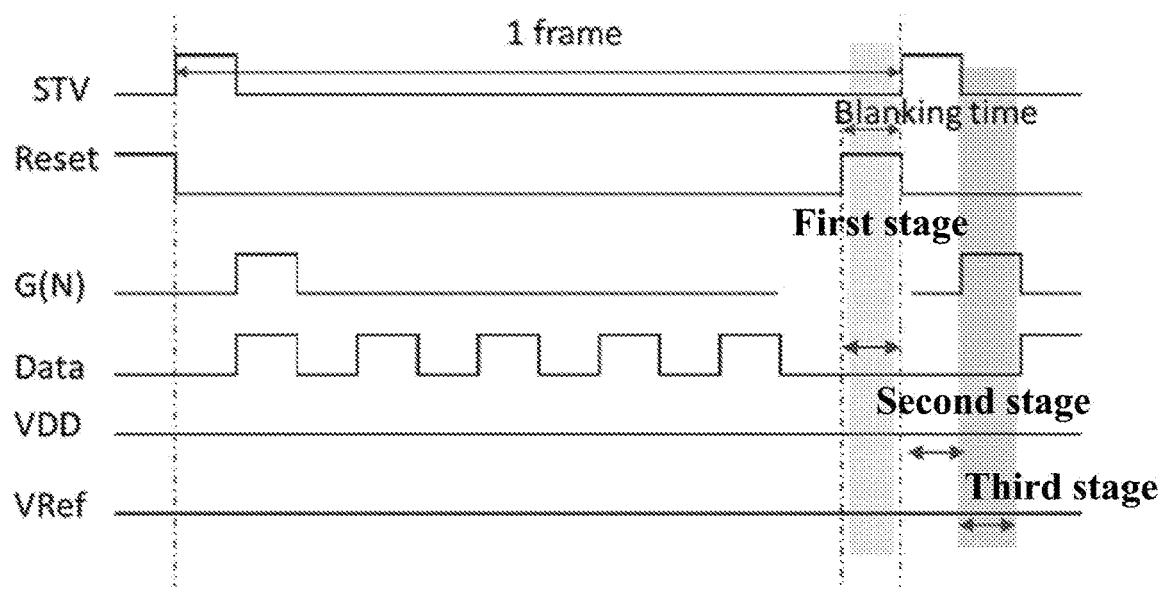
FIG. 4 is a waveform diagram of an OLED external compensation circuit of the first depletion type TFT according to the present invention.

FIG. 4 is a drawing of the corresponding waveform, which illustrates the correspondence between signals. STV is a trigger signal, and the time from the first STV to the second STV is used to define a frame time, the STV signal of the OLED display device is introduced to help understand the operation of the compensation circuit. The reset signal Reset starts in the blanking time of each frame and closes when each frame normally works. The blanking time refers to the interval between the end of the n-th frame image signal and the start of the (n+1)th frame image signal of the OLED display device.

The working status is described as below:

The First Stage:

Blanking time phase, at this stage, Reset is at the high potential, then T3 and T31 are opened, the signal of Vref is written to S(N) and T(N), and potentials of the gate electrode and the source electrode (the output electrode) of the TFT T2 are rewritten to the potential of Vref, and all the TFTs are homered. At this moment, $Vgs=Vg-Vs=V\_S(N)-V\_T(N) =Vref-Vref=0$.

The second stage: Vth extraction phase. At this time, the potential of G(N) and Reset are at low potentials, T1, T3, and T31 are closed. Since it is a depletion type TFT (Vth<0), T2 is still at the open phase.

$Vds=VDD-T(N)$. Since $Vgs=0<<Vds$, T2 is at the saturation phase. So at the final equilibrium stage, $Vgs=Vth$, and $Vs=Vg-Vth=Vref-Vth$.

The third stage: Vth compensation phase. When G(N) is on and T1 is on, the signal Vdata of data is written to node S(N). At T2, $Vgs=V\_S(N)-V\_T(N)=Vdata-(Vref-Vth) =Vdata-Vref+Vth$.

At this time, the current is independent from Vth according to the saturation current formula $Ids=\beta/2(Vgs-Vth)^2=\beta/2(Vdata-Vref+Vth-Vth)^2=\beta/2(Vdata-Vref)$, to get a good compensation.

Figure 5:
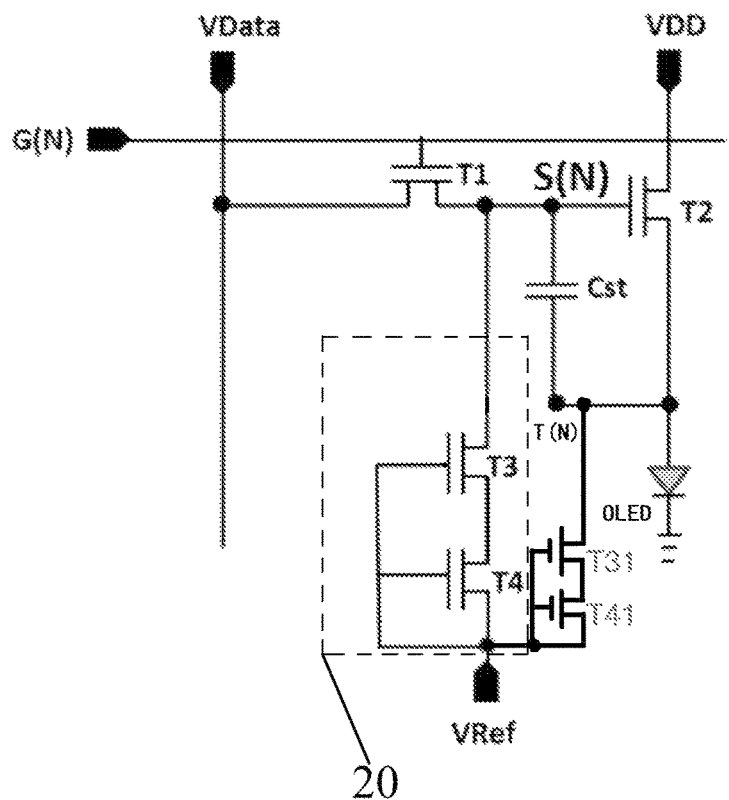
FIG. 5 is a schematic diagram of an OLED external compensation circuit of a second depletion type TFT according to the present invention.

FIG. 5 is a second embodiment of the external compensation circuit according to the present invention. The circuit is composed of four TFTs, respectively designated as a first TFT (T1) that has a gate electrode, an input electrode that is one of a drain and a source of T1 and an output electrode that is the other one of the source and the drain of T1; a second TFT (T2) that has a gate connected to a node S(N) that is a node between the output electrode of T1 and the gate electrode of T2 and is connected with the output electrode of T1, an input electrode that is one of a source and a drain of T2, and an output electrode that is the other one of the source and drain of T2 and is connected to a node T(N) that is a node between a positive electrode of an OLED and the output electrode of T2 and is connected to the positive electrode of the OLED, and a third TFT (T3) and a fourth TFT (T4), and one capacitor, Cst, which is connected between the node S(N) and the node T(N). A compensation circuit 20 of the second embodiment includes the third TFT T3 and the fourth TFT T4. A first additional thin film transistor T31 and a second additional thin film transistor T41 are also included in the circuit arrangement of this invention. A gate electrode of T3 is inputted with the AC reference potential Vref, a source electrode and a drain electrode of T3 are connected with a source/drain electrode of the T4 and the node S(N). A gate electrode of T4 is inputted with the AC reference potential Vref and the other source/drain electrode of T4 are also inputted with the AC reference potential Vref. A gate electrode of T31 is inputted with the AC reference potential Vref, a source electrode and a drain electrode of T31 are connected with a source/drain electrode of T41 and the node T(N). A gate electrode of T41 is inputted with the AC reference potential Vref and the other source/drain electrode of T41 are also inputted with the AC reference potential Vref. A negative electrode of the OLED is grounded. Vdata is the data signal and is applied to the input electrode of T1. G(N) is the signal corresponding to any gate line and is applied to the gate electrode of T1. The high potential is 28V and the low potential is −7V. VDD is a direct current (DC) high voltage power supply that is applied to the input electrode of T2 and the potential is generally set to 28V. Vref is the reference potential, which is an AC power supply, of which a high potential is 28V and a low potential is −7V.

Figure 6:
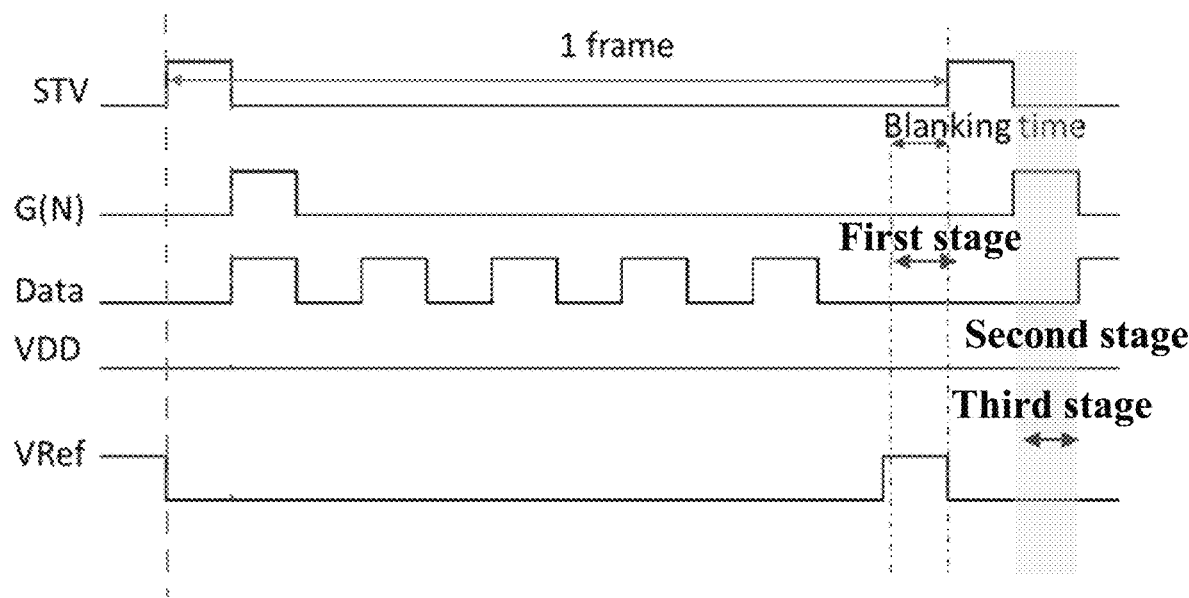
FIG. 6 is a waveform diagram of an OLED external compensation circuit of the second depletion type TFT according to the present invention.

FIG. 6 is a drawing of the corresponding waveform, which illustrates the correspondence between signals. STV is a trigger signal, and the time from the first STV to the second STV is used to define a frame time. The Vref starts in the blanking time of each frame and closes when each frame normally works.

Compared with the first external compensation circuit, the second circuit increases with a TFT and increases the space, but eliminates the need for a Reset signal, reducing the cost of the integrated chip (IC), in order to achieve cost reduction.

The working status is described as below:

The First Stage:

Blanking time phase, at this stage, Vref is at the high potential, then T3, T31, T4 and T41 are opened, signal of Vref is written to S(N) and T(N), potential of sides of the gate electrode and the source electrode (the output electrode) of the TFT T2 are rewritten to the potential of Vref, and all the TFTs are homered. At this moment, Vgs=Vg−Vs=V_S(N)−V_T(N)=Vref−Vref=0.

The second stage: Vth extraction phase. At this time, the potential of G(N) and Vref are at low potentials, T1, T3, T31, T4 and T41 are closed. Since it is a depletion type TFT (Vth<0), T2 is still at the open phase.

Vds=VDD−T(N). Since Vgs=0<<Vds, T2 is at the saturation phase. So at the final equilibrium stage, Vgs=Vth, and Vs=Vg−Vth=Vref−Vth.

The third stage: Vth compensation phase. When G(N) is on and T1 is on, the signal Vdata of data is written to node S(N). At T2, Vgs=V_S(N)−V_T(N)=Vdata−(Vref−Vth) =Vdata−Vref+Vth.

At this time, the current is independent from Vth according to the saturation current formula Ids=β/2(Vgs−Vth)^2=β/2(Vdata−Vref+Vth−Vth)^2=β/2(Vdata−Vref), to get a good compensation.

Figure 7:
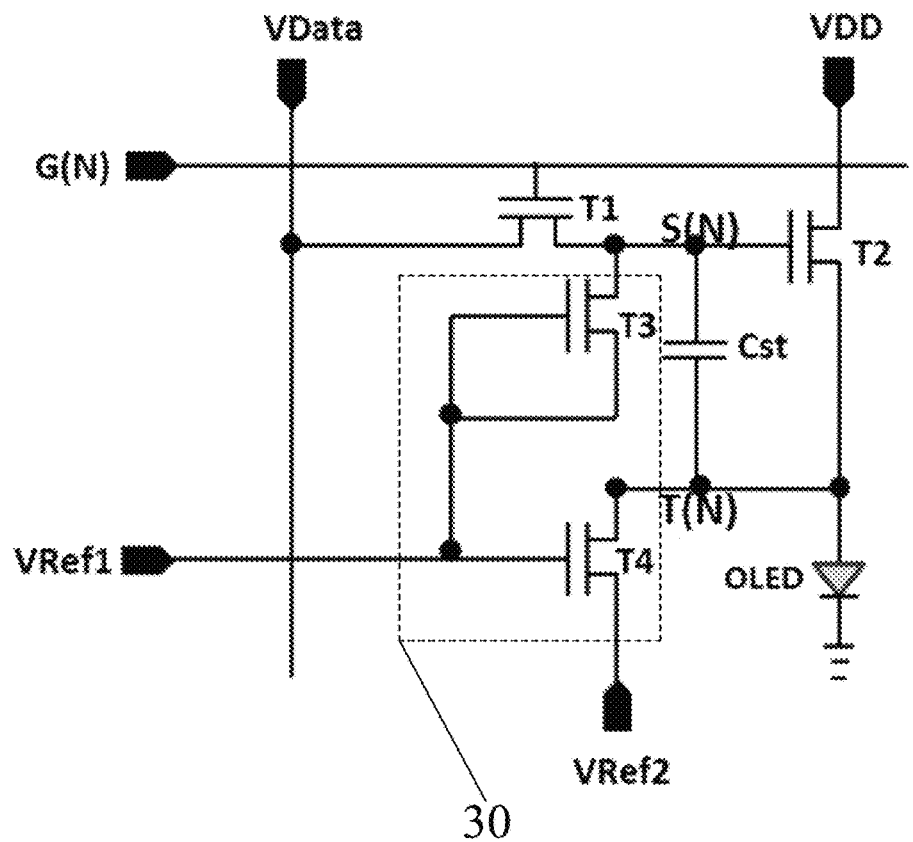
FIG. 7 is a schematic diagram of an OLED external compensation circuit of a third depletion type TFT according to the present invention.

FIG. 7 is a third external compensation circuit according to the present invention. The circuit is composed of four TFTs and one Cst. The compensation circuit 30 includes thin film transistors T3, T4. A gate electrode of T3 is inputted with the AC reference potential Vref1, a source electrode and a drain electrode of T3 are respectively inputted with the AC reference potential Vref and connected with the node S(N). A gate electrode of T4 is inputted with the AC reference potential Vref1. A source electrode and a drain electrode of T4 are respectively also inputted with the AC reference potential Vref2 and connected with the node T(N). Vdata is the data signal. G(N) is the signal corresponding to any gate line. The high potential is 28V and the low potential is −7V. VDD is a direct current (DC) high voltage power supply; the potential is generally set to be 28V. Vref1 and Vref2 are both the reference potential, which is an AC power supply, the high potential is 28V and the low potential is −7V. The voltage difference between Vref1 and Vref2 is adjustable.

Figure 8:
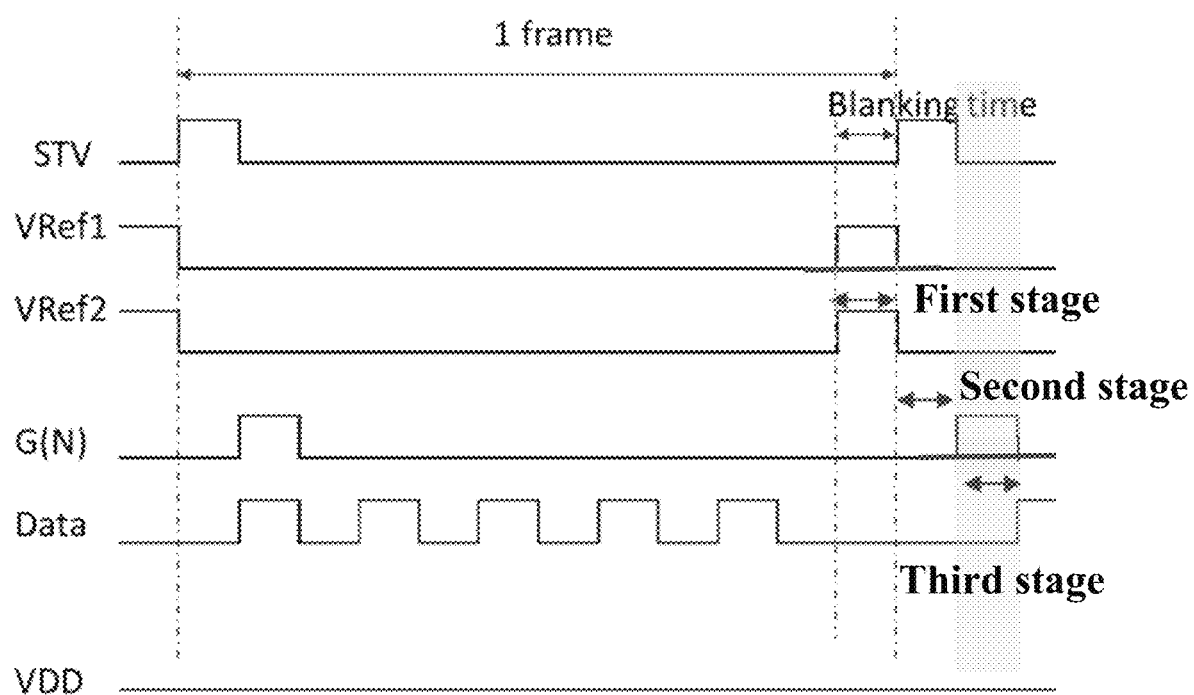
FIG. 8 is a waveform diagram of an OLED external compensation circuit of the third depletion type TFT according to the present invention.

FIG. 8 is a drawing of the corresponding waveform, which illustrate the correspondence between signals. STV is a trigger signal, and the time from the first STV to the second STV is used to define a frame time. The Vref starts in the blanking time of each frame and closes when each frame normally works.

Compared with the previous two circuits, it is characterized that the voltage difference between Vref1 and Vref2 is adjustable. The circuit can be compatible with enhanced TFT (Vth is positive) circuit.

The working status is described as below:

The First Stage:

Blanking time phase, at this stage, Vref1 and Vref2 are at the high potential, then T3 and T4 are opened, signal of Vref1 is written to T(N), in other words, potential of sides of the gate electrode and the source electrode of the TFT T2 are respectively rewritten to the potentials of Vref1 and Verf2, and all the TFTs are homered. At this moment, Vgs=Vg−Vs=V_S(N)−V_T(N)=Vref1−Vref2=0.

If the TFT is depletion type, Vth<0, Vgs=Vref1−Vref2 can be set to be less than or equal to 0 and greater than Vth.

If the TFT is enhancement type, Vth>0, Vgs=Vref1−Vref2 can be set to be greater than or equal to 0 and greater than Vth.

The second stage: Vth extraction phase. At this time, the potential of G(N) and Vref1 are at low potentials, T1, T3, and T4 are closed. For the setting of Vref1 and Vref2 is ensured that Vgs=Vref1−Vref2>=Vth, T2 is still at the open phase.

Vds=VDD−T(N). Since Vgs=Vref1−Vref2>=Vth, T2 is at the saturation phase. So at the final equilibrium stage, Vgs=Vth, and Vs=Vg−Vth=Vref1−Vth.

The third stage: Vth compensation phase. When G(N) is on and T1 is on, the signal Vdata of data is written to node S(N). At T2, Vgs=V_S(N)−V_T(N)=Vdata−(Vref1−Vth) =Vdata−Vref1+Vth.

At this time, the current is independent from Vth according to the saturation current formula Ids=β/2(Vgs−Vth)^2=β/2(Vdata−Vref1+Vth−Vth)^2=β/2(Vdata−Vref1), to get a good compensation.

In summary, the present invention provides an OLED external compensation circuit suitable for a depletion type TFT in view of the complicated characteristics of the conventional designs of the depletion type TFT and the OLED external compensation. The OLED external compensation circuit of another depletion type TFT of the present invention, which reduces the cost of the system chip, thereby achieving cost reduction. The OLED external compensation circuit of another depletion type TFT of the present invention can be compatible with an enhanced TFT (Vth is positive) circuit.

As mentioned above, those of ordinary skill in the art, without departing from the spirit and scope of the present invention, can make various kinds of modifications and variations to the present invention. Therefore, all such modifications and variations are intended to be included in the protection scope of the appended claims of the present invention.

What is claimed is:

1. An OLED external compensation circuit of a depletion type TFT, comprising a first thin film transistor, a second thin film transistor, a capacitor, an organic light emitting diode, and a compensation circuit, wherein the second thin film transistor is of a depletion type;

a gate electrode of the first thin film transistor is inputted with a gate line signal and a source electrode and a drain electrode of the first thin film transistor are respectively inputted with a data signal and connected with a first node;

a gate of the second thin film transistor is connected with the first node and a source electrode and a drain electrode of the second thin film transistor are respectively inputted with a DC high voltage power supply and connected with a second node;

two ends of the capacitor are respectively connected with the first node and the second node; and a positive electrode of the organic light emitting diode is connected with the second node and a negative electrode of the organic light emitting diode is grounded;

wherein the compensation circuit is connected with the first node and the second node, and an AC reference potential being inputted to the compensation circuit, wherein the AC reference potential is turned on at a blanking time of each frame when an OLED display device displays an image and is turned off when normally operated on each frame and wherein when the AC reference potential is turned on, the compensation circuit changes voltages of the first node and the second node; and wherein the compensation circuit comprises a third thin film transistor and a fourth thin film transistor, wherein the third thin film transistor has a gate electrode that is inputted with the AC reference potential and a source electrode and a drain electrode that are respectively connected with one of a drain electrode and a source electrode of the fourth thin film transistor and the first node; and the fourth thin film transistor has a gate electrode that is inputted with the AC reference potential, the other one of the source electrode and the drain electrode of the fourth thin film transistor being also inputted with the AC reference potential, the compensation circuit further comprising a first additional thin film transistor and a second additional thin film transistor, wherein the first additional thin film transistor has a gate electrode that is inputted with the AC reference potential and a source electrode and a drain electrode that are respectively connected with one of a drain electrode and a source electrode of the second additional thin film transistor and the second node; and the second additional thin film transistor has a gate electrode that is inputted with the AC reference potential, the other one of the source electrode and the drain electrode of the second additional thin film transistor being also inputted with the AC reference potential.

2. The OLED external compensation circuit of a depletion type TFT according to claim 1, wherein during operation:

in the first stage, the AC reference potential is at a high potential at which time the third thin film transistor, the fourth thin film transistor, the first additional thin film transistor, and the second additional thin film transistor are turned on and a signal of the AC reference potential is written to the first node and the second node;

in the second stage, the gate line signal and the AC reference potential are at a low potential, the first thin film transistor, the third thin film transistor, the fourth thin film transistor, the first additional thin film transistor, and the second additional thin film transistor are turned off and the second thin film transistor is still turned on;

in the third stage, when the gate line signal is at a high potential, the first thin film transistor is turned on and the data signal is written to the first node.

* * * * *